United States Patent
Smith (10) Patent No.: US 7,301,238 B2
(45) Date of Patent: Nov. 27, 2007

(54) STRUCTURE AND METHOD OF FORMING AN ENLARGED HEAD ON A PLUG TO ELIMINATE THE ENCLOSURE REQUIREMENT

(75) Inventor: Gregory C. Smith, Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/897,222

(22) Filed: Jul. 22, 2004

(65) Prior Publication Data

US 2005/0098899 A1    May 12, 2005

Related U.S. Application Data

(60) Division of application No. 08/866,456, filed on May 30, 1997, now Pat. No. 6,794,757, which is a continuation of application No. 08/366,180, filed on Dec. 29, 1994, now abandoned.

(51) Int. Cl.
*H01L 23/48* (2006.01)
*H01L 23/52* (2006.01)
*H01L 29/40* (2006.01)

(52) U.S. Cl. ............ 257/763; 257/764; 257/E23.145

(58) Field of Classification Search ......... 257/764, 257/763, 774, 758, 762, 771, E23.145
See application file for complete search history.

(56) References Cited

U.S. PATENT DOCUMENTS

| | | | |
|---|---|---|---|
| 4,242,698 A | 12/1980 | Ghate et al. | 257/71 |
| 4,495,220 A | 1/1985 | Wolf et al. | 427/82 |
| 4,592,802 A | 6/1986 | Deleonibus et al. | 156/644 |
| 4,994,410 A | 2/1991 | Sun et al. | 437/192 |
| 5,070,391 A | 12/1991 | Liou et al. | 357/71 |

(Continued)

FOREIGN PATENT DOCUMENTS

EP    0 506 426 A1    3/1992

(Continued)

OTHER PUBLICATIONS

Lee, P-I, et al., "Chemical Vapor Deposition of Tungsten (CVD W) as Submicron Interconnection and Via Stud," J. Electrochem. Soc. 136(7):2108-2112, 1989.

(Continued)

*Primary Examiner*—Phat X. Cao
(74) *Attorney, Agent, or Firm*—David V. Carlson; Lisa K. Jorgenson (57) ABSTRACT

The contact opening through an insulating layer is formed having a straight sidewall portion and a bowl shaped sidewall portion. The bowl shaped sidewall portion is near the top of the insulation layer to provide an enlarged diameter of the contact opening at the top relative to the bottom. A conductive material is then formed in the contact opening in electrical contact with a lower conductive layer. The conductive material forms a plug having an enlarged head, such as a nail head or a flat heat screw shape. The enlarged head protects the silicon and a barrier layer, if present, within the contact from being etched by any subsequent anisotropic etches. Thus, when an electrical interconnection layer such as aluminum is formed overlying the contact plug, the plug acts as an etch stop to prevent etching of a barrier layer of the barrier layer within the contact opening.

14 Claims, 5 Drawing Sheets

U.S. PATENT DOCUMENTS

| | | | |
|---|---|---|---|
| 5,124,780 A | 6/1992 | Sandhu et al. ................. | 357/67 |
| 5,180,689 A * | 1/1993 | Liu et al. ..................... | 438/640 |
| 5,202,579 A | 4/1993 | Fujii et al. ................... | 257/751 |
| 5,235,205 A | 8/1993 | Lippitt, III ................... | 257/528 |
| 5,254,872 A | 10/1993 | Yoda et al. ................... | 257/751 |
| 5,284,799 A | 2/1994 | Sato ........................... | 437/189 |
| 5,309,023 A | 5/1994 | Motonami et al. ........... | 257/773 |
| 5,317,187 A | 5/1994 | Hindman et al. ............. | 257/659 |
| 5,364,817 A | 11/1994 | Lur et al. ..................... | 437/192 |
| 5,430,328 A | 7/1995 | Hsue ........................... | 257/750 |
| 5,453,403 A | 9/1995 | Meng et al. .................. | 437/195 |
| 5,502,006 A | 3/1996 | Kasagi ......................... | 438/642 |
| 5,510,294 A | 4/1996 | Dixit et al. ................... | 437/195 |
| 5,519,239 A | 5/1996 | Chu ............................. | 257/314 |
| 5,530,280 A | 6/1996 | White .......................... | 257/508 |
| 5,530,294 A | 6/1996 | Kim ............................ | 257/774 |
| 5,580,821 A | 12/1996 | Mathews et al. ............ | 437/187 |
| 5,683,938 A | 11/1997 | Kim et al. ................... | 437/192 |
| 5,872,053 A | 2/1999 | Smith .......................... | 438/626 |
| 6,794,757 B1 * | 9/2004 | Smith .......................... | 257/764 |

FOREIGN PATENT DOCUMENTS

| | | |
|---|---|---|
| JP | 2-39469 | 2/1990 |

OTHER PUBLICATIONS

Estabil, J., et al., *Electromigration Improvements with Titanium Underlay and Overlay in Al(Cu)Metallurgy*, Jun. 11-12, 1991 VMIC Conference, General Technology Division, IBM Corporation, Hopewell Junction, NY 12533, pp. 242-248.

"Tungsten Plug Formation," *IBM Technical Disclosure Bulletin* 38(10):575, Oct. 1995.

Kaanta, Carter et al., *Submicron Wiring Technology with Tungsten and Planerization*, IBM General Technology Division, Essex Junction, Vermont 05452, pp. IEDM 87-209-IEDM87-212, 19787.

Kaanta, Carter et al., *Submicron Wiring Technology with Tungsten and Planerization*, 1988 Proceedings Fifth International IEEE VLSI Multilevel Interconnection Conference, Jun. 13-14, 1988, Santa Clara, CA, pp. 21-28.

Bartelink, D., et al., "Interconnects for Submicron Asic's," VLSI Technology Systems and Applications, 1989, pp. 59-62.

Bollinger, C. A., et al., "An Advanced Four Level Interconnect Enhancement Module for 0.9 Micron CMOS," VMIC Conference, Jun. 12-13, 1990, pp. 21-27.

Dalton, C., "Enhanced Selective Tungsten Encapsulation of TiW Capped Aluminum Interconnect," VMIC Conference, Jun. 12-13, 1990, pp. 289-295.

Fritsch, U., et al., "A Submicron CMOS Two Level Metal Process with Planarization Techniques," VMIC Conference, Jun. 13-14, 1988, pp. 69-75.

Graas, C., et al., "Electromigration Reliability Improvement of W-Plug Vias by Titanium Layering," IEEE/IRPS, 1994, pp. 173-177.

Ishihara, K., et al., "Ti/CVD-WSix/Blanket-W Structure for Fine Contact Filling Application," VMIC Conference, Jun. 11-12, 1991, pp. 185-191.

Saito, S., et al., "Three Dimensional Dimple Contact Technology for Lower Contact Resistance," VMIC Conference, Jun. 11-12, 1991, pp. 206-212.

Takata, Y., et al., "A Highly Reliable Multilevel Interconnection Process for 0.6µm CMOS Devices," VMIC Conference, Jun. 11-12, 1991, pp. 13-19.

Uttecht, R., et al., "A Four-Level-Metal Fully Planarized Interconnect Technology for Dense high Performance and SRAM Applications," VMIC Conference, Jun. 11-12, 1991, pp. 20-26.

Welch, M. T., et al., "Scalable VLSI Metallization," VMIC Conference, Jun. 15-16, 1987, pp. 51-57.

* cited by examiner

STRUCTURE AND METHOD OF FORMING AN ENLARGED HEAD ON A PLUG TO ELIMINATE THE ENCLOSURE REQUIREMENT

CROSS REFERENCE TO RELATED APPLICATIONS

The present application is a divisional of U.S. Application Ser. No. 08/866,456 filed May 30, 1997, (now U.S. Pat. No. 6,794,757), which was a continuation of U.S. Application Ser. No. 08/366,180 filed Dec. 29,1994 (now abandoned).

BACKGROUND OF THE INVENTION

1. Field of the Invention

The present invention relates generally to semiconductor devices, and more specifically, to a structure and method for forming electrical connections between levels of a semiconductor device.

2. Description of the Related Art

It is a common practice in the fabrication of integrated circuits to make use of an interconnection layer of aluminum, which is highly conductive while being relatively easy to deposit and etch, for connecting different elements of the integrated circuit to each other. This layer usually rests on an insulating layer which in turn is located above a conductive layer. The insulating layer is opened prior to deposition of the aluminum in order to expose the conductive layer surfaces with which to establish a metallic interconnection. These conductive surfaces can be monocrystalline silicon surfaces (transistor sources, drains, collectors, bases and emitters), polycrystalline silicon elements (field-effect transistor gates) or metallic surfaces of another interconnection layer. The contact opening is initially filled or "plugged" with a metallic layer, such as aluminum or tungsten, to make a solid electrical connection between the underlying conductive layer and the overlying interconnection aluminum layer.

However, problems occur with aluminum contact to silicon because of interdiffusion of aluminum in later process steps and may cause spiking in the silicon. To prevent spiking and alloying between an aluminum interconnection metal and silicon surface, a thin "barrier" or nucleation layer is deposited on the exposed silicon surface of the contact opening prior to filling the opening with aluminum. The most useful and practical barrier metal has been a titanium, or titanium nitride on titanium (TiN/Ti) bilayer which deposits well on silicon surfaces and also acts as glue for metal plugs of tungsten on silicon surfaces. The TiN/Ti scheme, however, has one major drawback. It does not deposit well on sidewalls of an opening. The bottom and sidewall coverage is especially important in "hot aluminum plug" processing in order to facilitate the surface diffusion of aluminum atoms into the contact opening and to withstand an even greater tendency for spiking due to the high aluminum deposition temperature. In order to ensure adequate deposition of the barrier film on the bottom and sidewalls of a contact opening for such aluminum plugs, it was previously necessary to step down the contact opening as shown in U.S. Pat. No. 4,592,802. However, such steps of the contact opening uses valuable layout space of a silicon structure.

This problem is partly solved by the use of chemical vapor deposition (CVD) tungsten etched back plug, a process well known in the art and described in U.S. Pat. No. 4,592,802, incorporated herein by reference. In this process, the contact opening is filled with tungsten to a level above the insulating layer to make sure the opening is completely filled. The deposited tungsten is then etched back without a mask until the insulating layer is exposed. Because CVD of tungsten is conformal, i.e., the deposition rate on vertical surfaces is the same as that of horizontal surfaces, this method produces a complete plug in the opening. By using this method, a barrier metal layer is no longer needed to prevent the problem of spiking between an aluminum plug and silicon.

Despite the success achieved with tungsten plugs in preventing spiking, however, it is still desirable to have a barrier metal layer in the contact opening. In order to uniformly deposit tungsten on an insulation layer with contact holes therein, it is strongly preferred to have a nucleation layer, usually of a barrier metal material or other glue material to ensure uniform deposit on all surfaces. Moreover, the barrier metal layer is desirable to prevent a phenomenon known as "tungsten encroachment" or "worm holing." Tungsten and silicon do not readily react at typical metallization temperatures of less than 500° C. However, the CVD of tungsten is performed using $WF_6$ and the fluorine in $WF_6$ reacts with silicon in the presence of tungsten which acts as a catalyst in the reaction. This tungsten encroachment problem is well known in the art and widely reported in industry literatures. A barrier metal layer such as TiN solves this problem by preventing fluorine from contacting silicon surfaces.

While the barrier metal is needed only at the bottom of the contact opening to prevent the tungsten encroachment problem, it is still necessary, or at least desirable, to deposit the barrier metal on the sidewalls of the contact opening as well. This is because tungsten does not readily deposit on an insulating layer such as $SiO_2$. Since the contact opening sidewalls are part of the insulating layer, a continuous barrier metal layer on the sidewalls is helpful to ensure conformal deposition of tungsten required to form a complete plug within the contact opening.

Hence, regardless of which metal (aluminum or tungsten) is used as a connection plug, the need for a continuous barrier metal layer on the sidewalls, especially in large aspect ratio contact openings, now about 3.5:1 to as much as 5:1 for advanced integrated circuits, is still present. Because of this, the industry has expended a great deal of effort in achieving conformal deposition of barrier metal in the contact opening. To this end, integrated circuit processing industry has recently developed a CVD of TiN process which provides good sidewall coverage of the contact opening and most manufacturers are moving toward CVD of TiN.

However, a good consistent barrier film in the contact opening which affords good adhesion to all surfaces and prevents encroachment at the bottom of contact openings presents a new difficulty. It is possible, in some instances, due to mask misalignment and other process variations, that the pattern of the metallic interconnection layer over a metal tungsten plug in the contact opening fails to completely cover every portion of that opening. In those cases, during etching of the metallic interconnection layer, the barrier metal exposed to the etching chemical will also be etched, which results in void formation or even etching of the barrier metal along the sidewalls of the contact opening.

Selective etching of tungsten relative to aluminum or titanium is easy to achieve. Tungsten, for example, is selectively etched with fluorine ions over titanium, titanium nitride, and aluminum. In addition, titanium, titanium nitride, and aluminum are selectively etched with chlorine ions relative to tungsten. Because of this etching selectivity, the tungsten plug within the contact opening can be etched back very uniformly and completely using titanium nitride, a barrier metal, as an etch stop. Then during the formation of an aluminum interconnection layer, for example, the tungsten plug is used as an etch stop for the aluminum. This aluminum etch process is relatively long due to the need to remove residual aluminum and titanium nitride near the contact opening.

Unfortunately, the chlorine etch preferred for etching aluminum also etches barrier metals such as titanium or titanium nitride. As a result, the barrier metal between the sidewall and the tungsten plug will also be etched when aluminum is etched. Because the etching period and over etch period for the aluminum metal is relatively long, the barrier metal on the sidewall can erode partially even towards the bottom of the contact opening (see FIG. 1, following). This may destroy the underlying conductive region such as a transistor source or drain located underneath the tungsten plug.

One method of preventing this problem is to make the interconnection layer of aluminum sufficiently large over the plug so that it completely covers and encloses the tungsten plug. A minimum enclosure defines the extra surface area which must be added to an interconnection layer in order to compensate for mask misalignment and other process variations. The widened portion over the plug may be typically approximately twice the interconnection layer width for small geometry devices. This enlarged area is designed to be centered on the interconnection layer, but it may be offset to one side and made sufficiently large to compensate for mask misalignment and other process variations. For example, if an interconnection layer has a width of 1 micron, the width of the region overlying the contact opening might be 2 microns to ensure complete coverage and enclosure of the tungsten plug and titanium sidewall (see FIGS. 2 and 3, following). It is disadvantageous to have wider interconnection layers or enlarged regions over a contact, especially in today's integrated circuit devices in which the circuit elements and interconnection layers are packed more tightly than ever before; in today's 0.35 micron technology devices, for example, the interconnection layers may be only 0.4–0.5 micron wide and stacked three to five levels deep.

Thus, it would be desirable to provide a contact opening that is not subject to erosion during formation of an interconnection layer. It would also be desirable to do this in such a way as to preserve much of the barrier metal deposited on the sidewalls so that deposition of a metal plug within the opening is conformal.

SUMMARY OF THE INVENTION

According to principles of the present invention, the contact opening in the insulating layer includes a bowl shaped sidewall portion and a straight sidewall portion. A thin layer of a barrier metal, such as titanium or titanium nitride, is deposited in the opening in contact with a conductive layer under the insulating layer. The thin layer of barrier metal covers the sidewall, both the bowl shaped sidewall portion and the straight sidewall portion. In addition, the barrier metal covers the upper surfaces of conductor at the bottom of the contact opening. A conformal conductive material is then formed within the contact opening, overlaying the barrier metal and filling the contact opening approximately to the top so that the top of the conformal conductive material is approximately coplanar with the upper surface of the insulating layer. The contact opening is larger in diameter at the top portion than it is at the bottom portion. The conformal conductive material thus has a larger diameter at the top of the contact opening and extends to cover, in a vertical alignment, the thin barrier layer positioned in the straight wall portion of the contact opening.

The conformal conductive material acts as a etch stop for the etch process which etches the barrier metal. The barrier layer and the conformal conductive material are selected such that each can be etched by different materials and one is the etch stop for the other in a selected etch process. For example, if a titanium material is used as the barrier layer, then tungsten is an appropriate choice for the conformal conductive material because tungsten can act as an etch stop to permit selective etching of the barrier metal of titanium which is covered by the tungsten. Other materials may also be selected for the barrier layer and the conformal conductive material which may be etched by different etch chemistries.

A second conductive layer is positioned on top of the conformal conductive material to provide an electrical interconnection from the second conductive material to the conductive layer under the insulating layer. The conformal conductive material is an etch stop for a process which etches the second conductive material. Generally, the second conductive material is an aluminum interconnection layer which overlays the conductive tungsten plug to provide ohmic contact between various circuit elements on the integrated circuit. Tungsten is an etch stop for aluminum.

According to the method of the present invention, a conductive layer is formed as part of an integrated circuit. An insulator layer is formed overlying the conductive layer. A mask is formed overlying the conductive layer and an opening is provided in the mask. An isotropic etch is performed with the mask in place to isotropically etch into the insulating layer through the opening. This etch will create an enlarged region, larger than the masked opening within the insulating layer because it is an isotropic etch. After the isotropic etch is conducted for a brief period of time, the etch is terminated. Subsequently, an anisotropic etch is carried out using the same mask opening. The anisotropic etch is approximately the same dimension as the opening and forms a straight sidewall portion of the contact opening. The anisotropic etch continues until the insulating layer is completely removed within the mask opening and the lower conductive layer is exposed.

A thin layer of barrier material is formed overlying the sidewalls of the contact opening, both the bowl shaped sidewall portion and the straight sidewall portion. The layer of barrier material also overlies the conductive material. A conformal conductive material is then deposited, overlying the thin layer of barrier material to sufficient thickness to fill the contact opening. A second conductive material is then deposited overlying the insulating layer and also overlying the conformal conductive material. The second conductive material is anisotropically etched to form a desired interconnection pattern. During the anisotropic etching of the second conductive material, the conformal conductive material acts as an etch stop to prevent etching of the barrier metal positioned vertically below it.

The invention provides the advantage that the second conductive material can be etched to form an interconnection layer without the need to ensure that it completely overlies all portions of the contact opening. The conformal conductive material, being selected as an etch stop for both the second conductive material and the thin barrier metal. The etched interconnection can be made sufficiently thin over the contact opening that it provides good electrical contact without the necessity to completely enclose the contact opening. Increased density for forming interconnection lines is permitted.

DETAILED DESCRIPTION OF THE INVENTION

Figure 1:
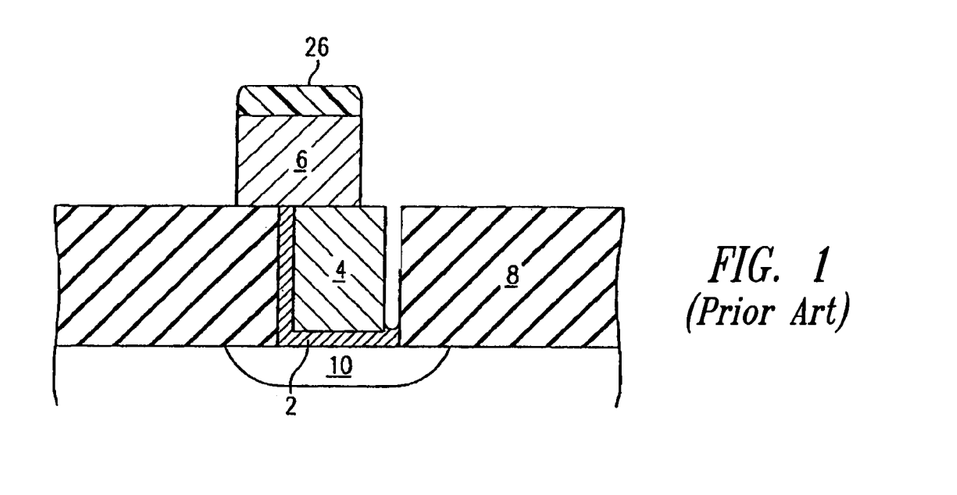
FIG. 1 shows a cross-sectional view of a contact opening that is not covered by an interconnection layer and illustrates the risk of erosion of the barrier metal.

FIG. 1 illustrates the problem recognized by the applicant. A photoresist 26 used to pattern an interconnection layer 6 may be misaligned with an underlying connection area. During etching of the interconnection layer 6 such as aluminum, a deposited metal plug 4 such as tungsten is used as an etch stop. If the photoresist 26 is misaligned with the metal plug 4, the exposed barrier metal 2 is etched along with aluminum 6. The barrier metal layer 2 erodes along the sidewall of the contact opening as shown. This will result in less than solid electrical contact between the interconnection layer 6 and an underlying conductive layer region 10.

It is common in the art to over etch during an aluminum etching process due to the need to remove residual aluminum and barrier metal near the contact opening. Consequently, in the worst case, the erosion of the barrier metal 2 may continue all the way down the sidewall and onto a portion of the conductive layer 10 destroying the associated electrical circuit. As there are more than a million electrical circuits in today's integrated circuit chips, those skilled in the art will appreciate that even one defective circuit can render the entire integrated circuit chip unusable. Even if the etch does not remove the titanium to the layer 10, it may still be etched from the sidewall sufficiently to cause the plug 4 to move in the hole and create electrical problems.

Figure 2:
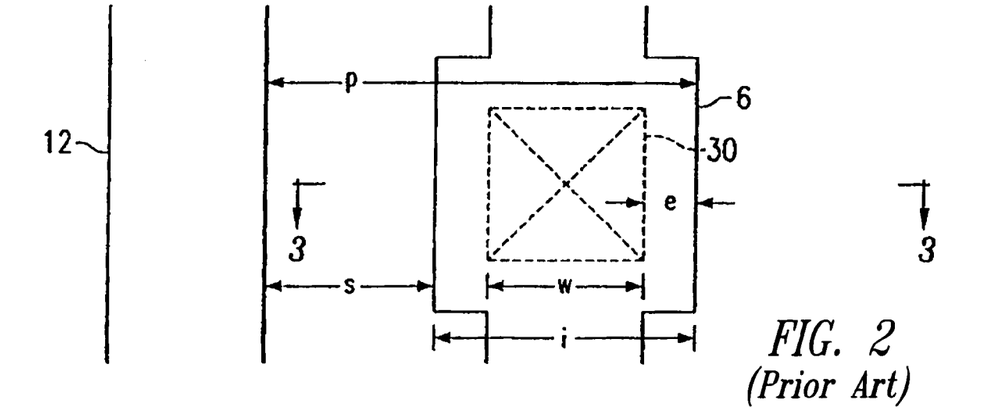
FIG. 2 is a plan view of a prior art interconnection layer formed over a contact opening.

FIG. 2 shows a plan view of a prior art interconnection layer 6 formed over a contact opening 30 for preventing the side erosion problem by using the enclosure rule discussed above. A widened portion of the interconnection layer 6 is centered over the contact opening 30. A second interconnection layer 12 runs alongside the first layer 6. While the width of the interconnection layer is only w, extra width of e must be added to each side of the layer 6 to compensate for a maximum misalignment of e to either side of the contact opening 30. This will increase the pitch p (width of interconnection layer i+spacing s) between interconnection layers 6, 12 at the level of contact openings resulting in waste of valuable layout space.

Figure 3:
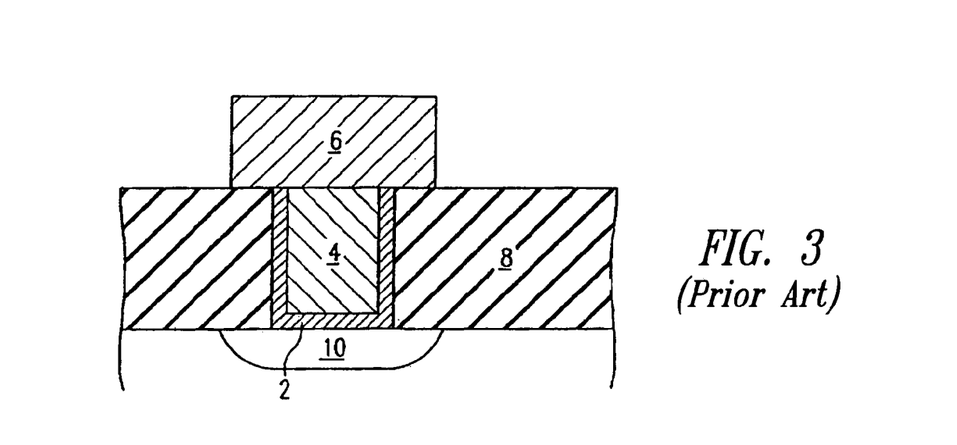
FIG. 3 is a cross-sectional view of the prior art device taken along lines 3—3 of FIG. 2.

FIG. 3 is a cross-sectional view of the prior art interconnection layer 6 taken along lines 3—3 of FIG. 2. As can be seen, the enclosure requirements reduce the density of interconnection layers 6, 12 that can be formed over the insulating layer 8 since each layer has a portion with a widened area over the contact opening.

Figure 4:
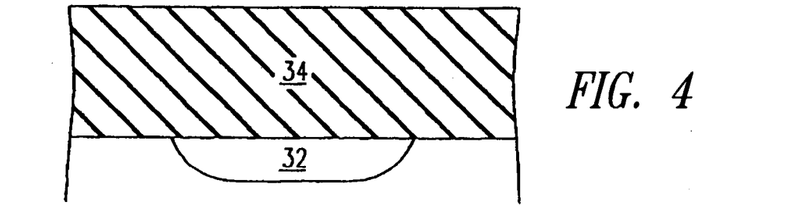
FIGS. 4–15 illustrate various steps in the formation of contact opening according to principles of the invention.

FIG. 4 illustrates a conductive layer 32. The conductive layer 32 is any conductive layer in the integrated circuit and includes, for example, the substrate itself, a heavily doped region in the substrate, a polysilicon layer overlying the substrate or a metallic layer overlying the substrate.

Figure 5:
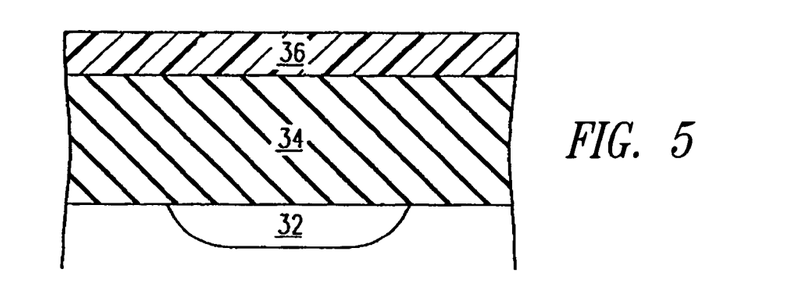

An insulating layer 34 is formed over the conductive layer 32 as illustrated in FIG. 5. The insulating layer 34 and conductive layer 32 are not shown to scale; each layer may be somewhat thicker or thinner relative to each other in the actual device. The insulating layer 34 is of a type that will provide insulation between the conductive layer 32 and overlying conductive interconnection layers to be formed thereon. Any suitable insulating layer is acceptable, such as silicon dioxide, silicon nitride, or the like.

Figure 6:
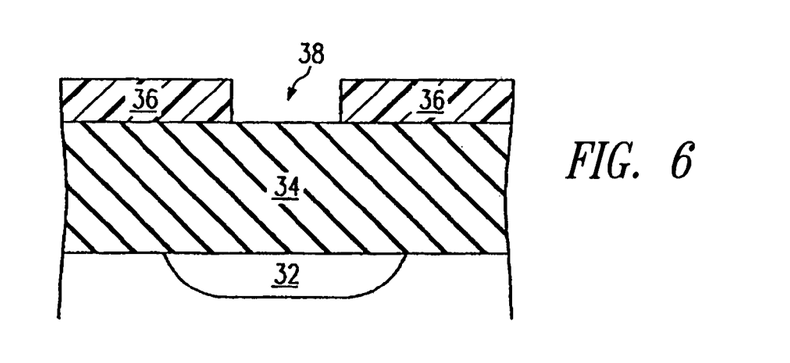

A photoresist 36 is formed overlying the insulating layer 34. Again, the dimensions of the various layers, such as the photoresist 36, are not shown to scale. As shown in FIG. 6, an opening 38 is formed in the photoresist 36 using photolithographic techniques as is known in the art.

Figure 7:
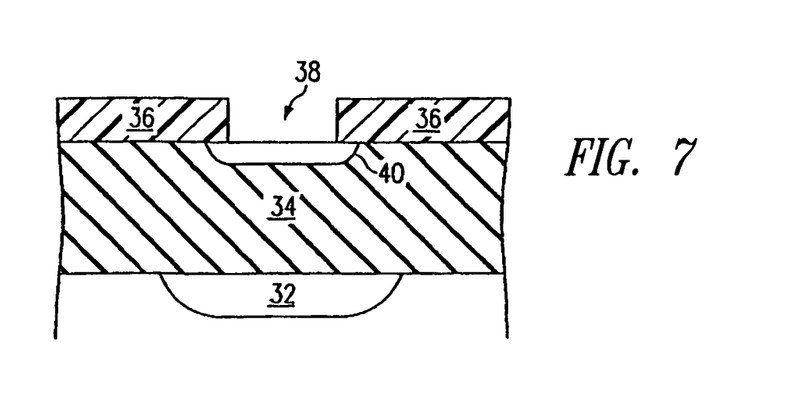

As shown in FIG. 7, with the photoresist 36 in place an isotropic etch is carried out through the opening 38. The isotropic etch etches generally uniform in all directions through the opening 38, creating a bowl shaped sidewall portion 40 which underlies the photoresist 36. Any isotropic etch for the insulating layer 34 is acceptable. Many isotropic etches are known in the art. A dry isotropic etch will generally produce the bowl shaped edge 40 having a curved region as shown in FIG. 7. On the other hand, a wet isotropic etch would generally produce a bowl shaped edge 40 having a straight region (see FIG. 10).

An isotropic etch has the desirable effect of creating a larger opening in the insulating layer 34 than the opening 38 that is the mask for the isotropic etch. The enlarged etch opening is advantageous for forming the enlarged head on the contact opening as explained herein. The term "bowl shaped" is used herein in a rather broad sense of a surface which has a slope. The slope causes the diameter of the opening to gradually change from a larger diameter to a smaller diameter. The bowl shape may have a uniform straight slope, a curved slope, a variable slope or some other shape which creates a reduction in the diameter of the opening from a top portion of the bowl shaped region to the bottom portion of the bowl shaped region.

Figure 8:
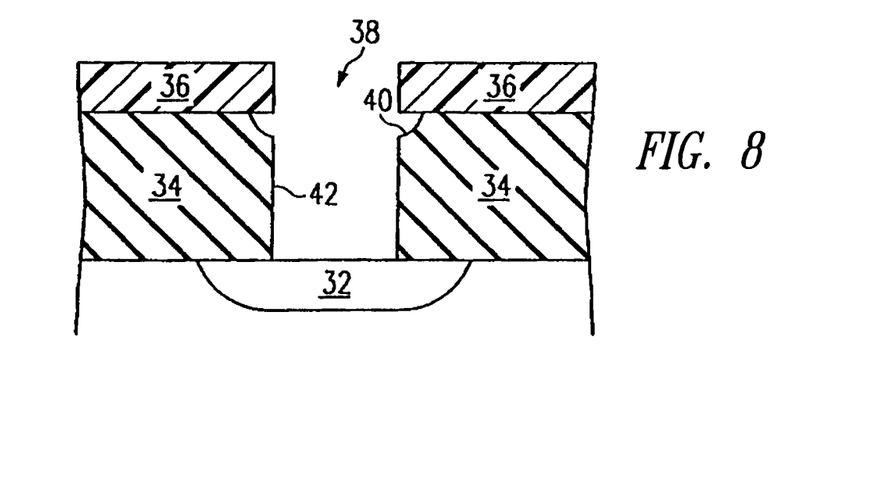

As shown in FIG. 8, after the isotropic etch of FIG. 7 is completed, the insulating layer 34 is subjected to an anisotropic etch to the same mask opening 38. Anisotropically etching the insulating layer 34 creates straight sidewall portions 42 having approximately the same diameter as the opening 38. The insulating layer 34 is anisotropically etched until the conductive layer 32 is exposed to the opening.

Figure 9:
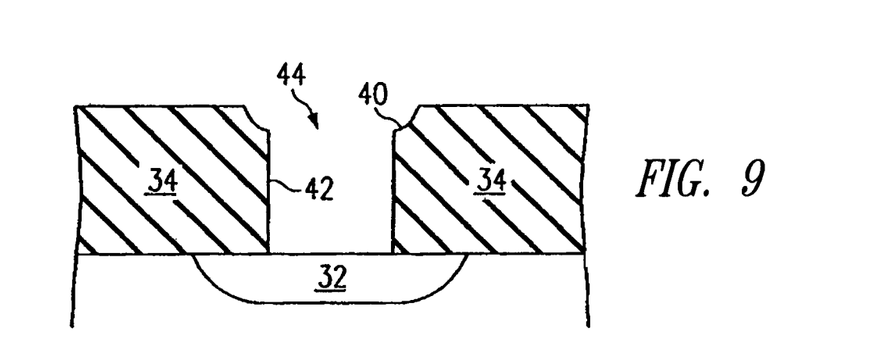

FIG. 9 illustrates the contact opening 44 formed in the insulating layer 34 having a bowl shaped sidewall portion 40 and a straight sidewall portion 42. The contact opening 44 has a larger cross-sectional area at the top of the opening than at the bottom of the opening. This enlarged cross-sectional area is gradually reduced at the portion 40 at the top of the contact opening. The straight wall portion 42 extends in a generally uniform cross-sectional area from the end of the portion 40 until the conductive layer 32. The cross-sectional shape of the contact opening 44 is any desired shape according to the integrated circuit design rules. Generally, the contact opening 44 will be round in cross section (viewed from the top); however, it may be rectangular, square, square on two sides and sloped on the other sides, or any other acceptable opening shape as will be appreciated by those of skill in the art as may be required by the layout of the integrated circuit.

Figure 10:
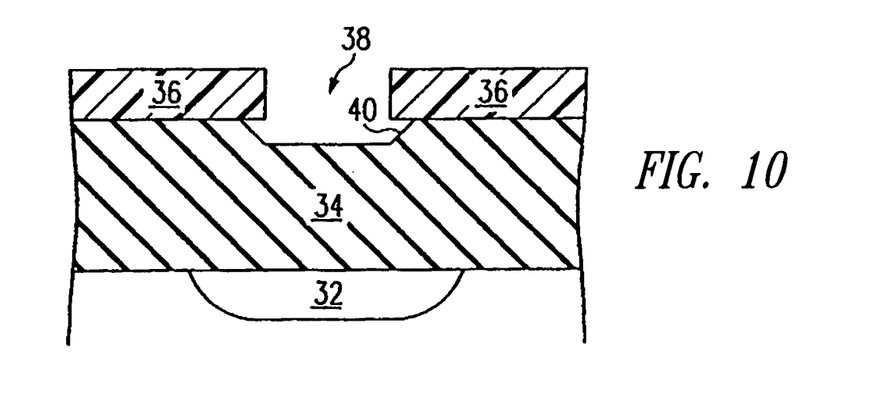
Figure 11:
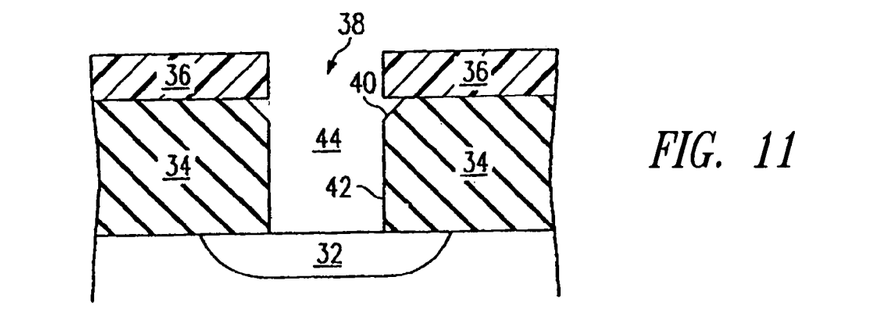

FIGS. 10 and 11 illustrate the formation of a bowl shaped sidewall 40 which is of a uniform slope rather than a variable slope. The same insulating layer 34 and photoresist 36 having a mask opening 38 therethrough are used. A wet isotropic etch, rather than a dry isotropic etch, is used through the opening 38 to create a generally straight bowl shaped portion 40, rather than the sloping bowl shaped portion 40 of FIGS. 7-9 and 16. FIG. 11 illustrates the anisotropic etch through the same mask opening 38 to create the straight sidewall portion 42 which exposes the conductive layer 32.

Figure 12:
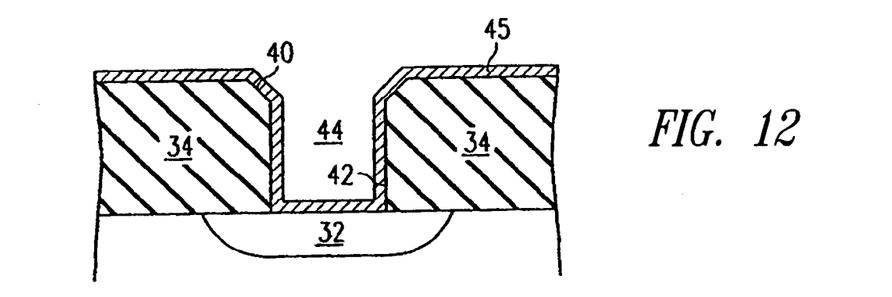

As shown in FIG. 12, the photoresist 36 is removed and a thin layer of barrier material 45 is formed on the insulating layer 34. The barrier material 45 is preferably titanium, titanium nitride, or titanium on nitride bilayer. Alternatively, other alloys or compounds which provide the desired barrier material may be used. In many embodiments, this barrier material will be a barrier metal containing the titanium, or some other acceptable metal or semi-metal which may be formed on the sidewalls of the contact opening.

The barrier material layer 45 is formed by any suitable process. The formation can be a deposition done by sputtering a barrier metal 45 or, alternatively, use of a relatively new process of barrier metal CVD deposition. Generally, the CVD method limits the choice of barrier metal to titanium nitride with today's process technology, though future process technology may permit use of a barrier layer 45 of various other types of materials.

The barrier layer 45 generally has a thickness in the range from 100 Å up to 2000 Å, depending on the design requirements. In a preferred embodiment, the layer 45 is 500–600 Å thick. A thinner barrier layer 45 is preferred according to the principles of the present invention so that the enlarged diameter portion may be kept as small as possible as may be explained in more detail herein. The barrier layer 45 is preferably formed using a technique which provides good coverage of the bowl shaped portion 40, the straight walled portion 42, and the conductive layer 32.

Figure 13:
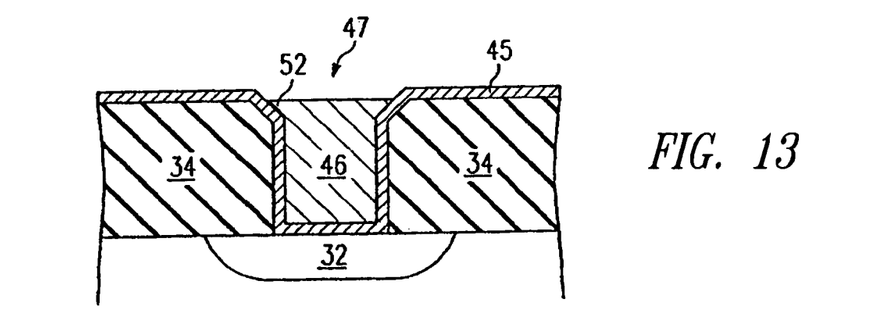

As shown in FIG. 13, a conformal conductive material 46 is then deposited and blanket etched over the insulating layer 34. The conformal conductive material 46 is preferably a tungsten layer deposited by CVD deposition using techniques known in the art. The deposited tungsten layer is then etched back without a mask until it leaves a portion 46 which fills the contact opening 44 having a top surface approximately planar with the top surface of the insulating layer 34. According to a preferred embodiment, the conformal conductive layer 46 can be etched selectively with respect to the barrier layer 45. Thus, the barrier layer 45 acts as an etch stop to the etching of the conducting material 46, permitting the etching to occur without a mask. When the conformal conductive material 46 has been completely removed from the top surface of the insulating layer 34, the barrier layer 45 acts as an etch stop. The etching may continue for a selected period of time after the barrier layer 45 is exposed. This process forms a conductive plug 47 having an enlarged head portion 52 which is in electrical contact with the conductive layer 32 and is approximately co-planar with the top surface of the insulating layer 34. The enlarged plug diameter 52 is particularly advantageous during the later etching steps, as will now be explained.

Figure 14:
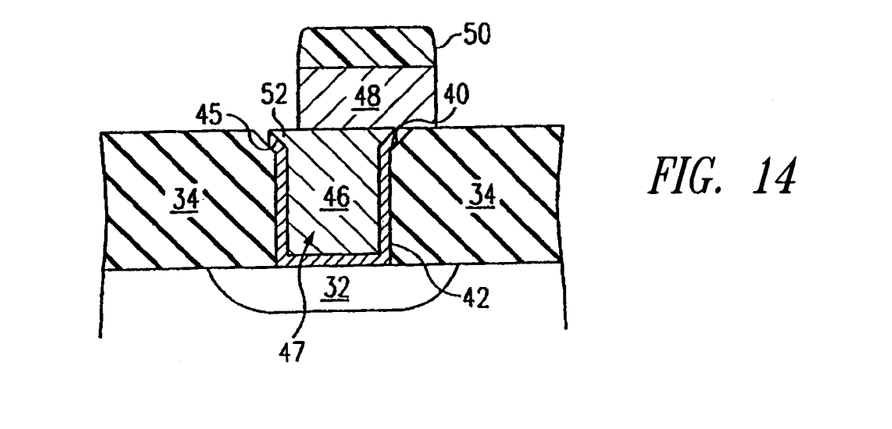

As shown in FIG. 14, the barrier material 45 is then anisotropically etched without a mask. A second conductive material is blanket deposited over the insulating layer 34. The second conductive layer 48 is then masked with a photoresist and etched to create a desired interconnection pattern thereon. Preferably, the thin barrier layer 45 can be selectively anisotropically etched with respect to the conformal conductive material 46. Thus, a blanket anisotropic etch is performed to remove the barrier layer 45 and the conformal conductive layer 46 acts as an etch stop to prevent etching of any material 45 which is overlaid by the conformal conductive material 46.

During an anisotropic etch of the barrier layer 45, the enlarged portion 52 of the plug 47 acts as a mask to prevent etching of any of the barrier layer 45 which is positioned vertically below the conformal conductive material 46. Thus, while a small portion of the barrier material 45 at the very top of the contact opening 44 may be etched, this will be limited to only a very small amount. As the plug gradually reduces in diameter at the bowl shaped sidewall portion 40, the enlarged diameter portion 52 will protect the barrier layer 45 from being etched. Thus, the majority of the barrier layer 45 within the contact opening 44 will be preserved intact and are not subject to being removed during any subsequent etching steps.

Following the blanket deposition of the interconnection layer 48, a photoresist is deposited, patterned and the layer 48 is anisotropically etched. The anisotropic etch of the layer 48 continues until all fringes and undesired portions of the layer 48 are completely removed. This generally requires an overetch of a selected time period. The conformal conductive material 46 is an etch stop to the anisotropic etching of the interconnection layer 48. Thus, during the overetch the conformal conductive layer 46, usually tungsten, is not etched by the same chemistry which etches the second conductive material, usually aluminum. The aluminum interconnecting layer may be composed of any acceptable aluminum material, alloy, or mixture thereof, many being suitable for use as interconnection layers. These may be aluminum/copper or aluminum/copper/silicon or other suitable mixtures.

Generally, the preferred etch for the interconnecting layer 48 is not a selective etch to the barrier layer 45. Thus, the same etch chemistry for etching the layer 48 also etches the barrier layer 45. As explained in the Background of the Invention and shown in FIGS. 1–4, this creates the potential in the prior art that overetching of the interconnection layer 48, usually aluminum or an aluminum alloy, will etch important portions of the barrier layer 45 and create potential defects in the integrated circuit. The enlarged portion 52 of the conductive plug of material 46 protects the barrier layer 45 under the enlarged head portion 52. Thus, even though the aluminum may be overetched, the integrity of the barrier layer 45 within the contact opening 44 is protected by the enlarged head portion 52 of the contact plug 47.

Figure 15:
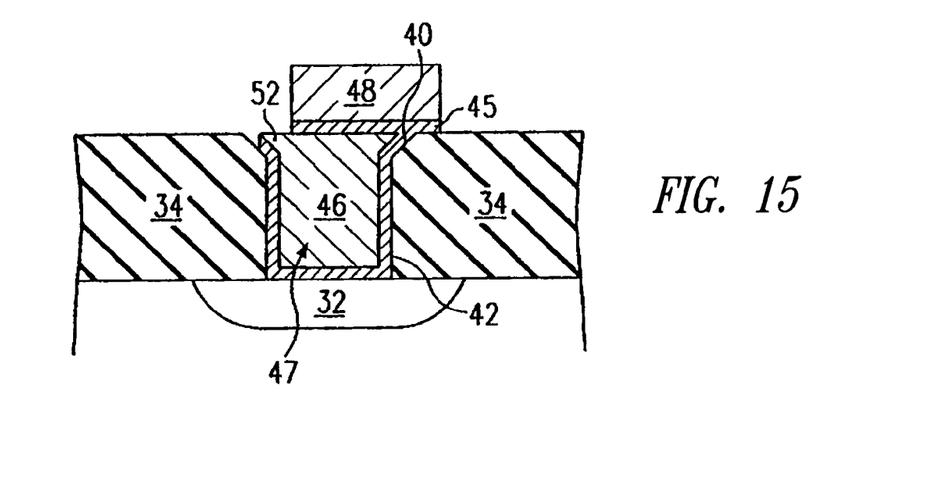

FIG. 15 illustrates an alternative embodiment in which the barrier layer 45 is not etched prior to the blanket deposition of layer 48 and subsequent etching of the second conductive layer 48. In this alternative embodiment, the conductive layer 48 is blanket deposited overlying the barrier layer 45. A photoresist is then formed, exposed, developed, and used as a mask for etching the second conductive layer 48. The second conductive layer 48 is anisotropically etched to remove all portions not covered by the photoresist. The anisotropic etch of the layer 48 in the presently preferred embodiment using a chlorine etch of aluminum also etches the barrier material 45 composed of titanium or titanium nitride. Thus, any overetching of the aluminum 45 will also etch the titanium layer and remove it from the substrate. During this anisotropic etch, the tungsten material 46 with the enlarged diameter portion 52 protects the barrier material 45 from being etched. Of course, that portion of the barrier layer 45 which is overlaid by the conductive layer 48 that is protected by the photoresist will not be etched. Thus, a residual barrier layer 45 will be left underneath the layer 48, providing an aluminum titanium tungsten sandwiched layer formed in the electrical interconnection from the conductive layer 32 to other integrated circuit elements.

Figure 16:
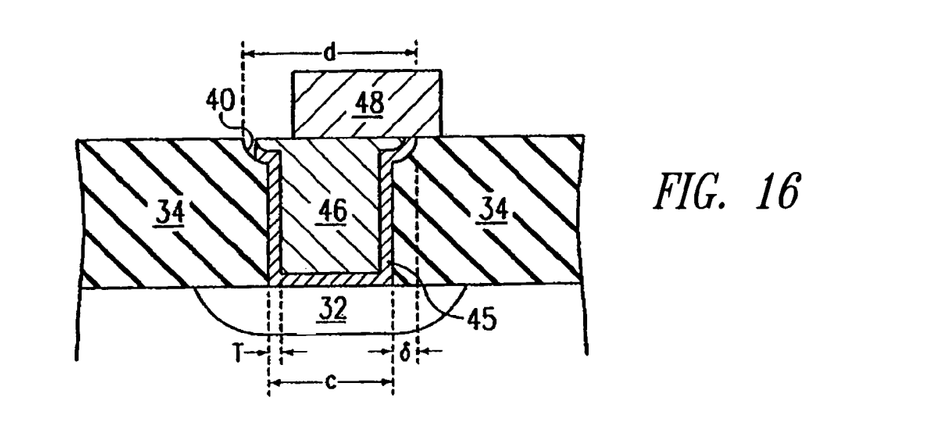
FIG. 16 illustrates an embodiment of a bowl shaped sidewall portion which is curved.
Figure 17:
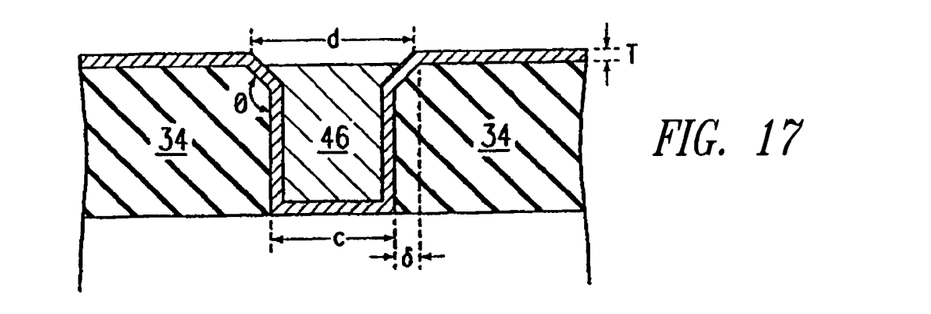
FIG. 17 illustrates the parameters of interest in forming a contact opening having a bowl shaped sidewall portion.

FIGS. 16 and 17 illustrate the advantages and properties of various shapes for the bowl shaped sidewall portion 40. As shown in these two figures, the contact opening 44 has a first cross-sectional diameter c at the straight wall portion 44 and a second, larger cross-sectional diameter d at a top portion. (The term "diameter" being used in the broad sense to refer to the lateral dimension of the opening, even though strictly speaking, the opening 44 may not be a circle but may be an oval. In the photo mask, the opening may be shown as a rectangle, square, five- or six-sided figure or other shape as appreciated by those of skill in the art, but these will all usually result in a generally round or oval contact opening in the insulating layer as formed.) The cross-sectional diameter c of the contact with interconnecting layer 32 is selected to be as narrow as desired and still provide good electrical connection according to the design rules selected for the integrated circuit. The enlarged head has a portion which is increased by δ over the lower portion. The contact hole 44 is thus enlarged by dimension δ on all sides, such that the total diameter d is equal to the diameter c plus 2δ. This difference δ is selected to be sufficient to ensure that the enlarged portion 52 of the plug adequately protects the barrier material 45 within the straight wall portion 42 during an anisotropic etch.

FIG. 17 illustrates the selection of the diameter d assuming a straight bowl shaped portion 40. The increase of plug 47 diameter required to prevent etching of the barrier layer 45 to the bottom of the contact 32 is given by the equation $\delta = T/\sin\theta$, where θ is the angle of the straight slope of the bowl shaped portion 40. For example, in the case of a 0.35 micron contact opening c, a 600 Å barrier layer 45 and an angle θ of 45°, the contact diameter d at the top is preferably 0.52 micron. The dimension will, of course, be somewhat different if the thickness is greater or less, or if the angle θ is different. For example, a higher angle θ such as 60° would result in a somewhat smaller requirement for the minimum δ. Of course, δ may be somewhat larger than the minimum permitted dimension to provide the assurance that the barrier metal 45 will not be excessively etched within the contact opening 44 during any subsequent steps.

Any overetching of the conformal conductive material 46 will reduce the diameter d of the enlarged head portion 52 as it gradually recesses down the bowl shaped portion of the opening 40. In selecting δ, it is desirable to allow for the plug recession due to etch back of the plug itself which will also decrease slightly the enlarged diameter of the portion 52 of the material 46 if a straight bowl shape is used. A slope 40 or a curved bowl shaped portion 40 having a relatively sharp bend is more insensitive to plug recession due to overetch and thus a bowl shape having these features is preferred, depending on the ease of formation of such a bowl shaped sidewall portion during the etching with mask 36 in place through the contact opening 38 which will be used to form the straight sidewall portion 42.

If the bowled sidewall 40 is a curved sidewall, as illustrated in FIG. 16, a δ equal to the thickness T of the barrier material 45 is acceptable. The plug having an enlarged portion 52 which at least equals the thickness of the barrier layer 45 on all sides will adequately protect the straight wall portion of the barrier layer 45 during any subsequent anisotropic etching steps. Generally, the thickness T will be in the thickness in the range of 100 Å to 2000 Å; however, a thinner layer is preferable according to principles of the present invention so that the enlarged diameter portion d is kept as small as possible. Thus, assuming a thickness T of 300 Å, the diameter d will be generally 600 Å larger than that of diameter c. The 600 Å enlarged diameter will provide approximately 300 Å enlarged portion 52 surrounding the entire contact hole 44 and forming the top of the plug of material. Depending on the shape and slope of the curve of the bowled edge 40, the enlarged diameter portion d may be somewhat larger or somewhat smaller than twice the thickness T of the barrier material 45. As will be appreciated, for a thin barrier layer 45, the enlarged diameter portion d is kept as close to the diameter c as possible and still provide adequate protection for the barrier 45 against subsequent anisotropic etching. The thickness of the barrier layer 45 may be selected according to various design criteria to provide good electrical connection to the conductive layer 32, as will be appreciated by those of skill in the art.

The increase of contact size required to prevent etch on the barrier layer 45 is thus reduced if an isotropic dry etch is used to define the enlarged head portion 52 at the top of the contact opening 44, as previously described. In this case, the minimum 6 is approximately equal to the thickness of the barrier layer 45 and is insensitive to plug recession due to overetching of the material 46 during the prior step. Any slight overetching of the plug 47 having the curved sidewall 40 shown in FIG. 16 will not reduce the diameter of the plug.

It is appreciated that the contact size at the top of the insulation layer 34 is somewhat larger than what would otherwise be the case with a straight sidewall portion to the entire length of the contact plug. However, the increase in diameter of 2δ is significantly less than that required by the enclosure rules for an aluminum layer 48 which overlies a tungsten plug. Thus, the aluminum layer 48 may now be made extremely narrow, and of uniform width along its entire length without being concerned with ensuring enclosure to all portions of the contact plug. The layer 48, being etched with a different mask than formed in the plug 47, requires an enlarged portion e equal to the alignment tolerance from one mask to the next to ensure that there is complete enclosure and coverage of the contact plug. On the other hand, the present invention provides for self-alignment of the two portions of the contact opening.

The enlarged portion of the contact opening is self-aligned with the narrow opening because a single masking step is used to define both openings. Both etches occur through a single mask opening 38 and the tolerances can be as tight as those permitted by the various etch processes, both isotropic and anisotropic, which are carried out in forming the contact opening 44. This self-alignment of the plug 47 to the interconnection layer processes permit a much more dense spacing of contact plugs in interconnection layers 48 than is otherwise permitted by the prior art enclosure rules for aluminum contacts over tungsten plugs.

It is now possible therefore to use an interconnection layer 48 which only partially overlies the plug 46 and, so long as adequate surface areas are in contact for an ohmic connection, the overlap will be sufficient to provide good electrical operation of the circuit.

As will be appreciated, the sidewall portion 42 need not be absolutely vertical in all embodiments. In an alternative embodiment, the straight sidewall portion 42 is also tapered slightly inward towards the slightly reduced diameter. The formation of a straight sidewall portion 42 having a slight inward taper is acceptable for forming a contact opening 44 according to principles of the present invention. There are certain etches available in the art today which permit the slight tapering of a straight edge portion 42 and these may be used to create a straight sidewall portion 42. According to principles of the present invention, the contact opening 44 has at least two portions with different slopes from each other. A first portion 40 has a selected slope and a second slope portion 42 has a second, significantly steeper slope. The slope of the first portion 40 may be slightly curved if desired, ending in approximately a horizontal slope. Alternatively, it may be a uniform straight slope throughout the entire portion, but less steep than the portion 42. When a conductive material 46 fills the contact opening 44, the change in slope provides the enlarged head portion 52 of the plug which serves as an etch stop to prevent etching of the conductive layer 32 and of the barrier layer 45.

While various embodiments have been described in this application for illustrative purposes, the claims are not limited to these embodiments. Many modifications can be made to the structures shown and described herein that take advantage of the present invention and fall within the invention. The claims are intended to be read as broadly as the invention of the prior art permits. For example, other process steps may be substituted for those taught herein in achieving the invention. Any process steps, or structures which are equivalent to those which have been substituted and disclosed herein, fall within the scope of the present invention.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. An electrical connection structure, comprising:
   a first layer having a conductive region;
   an insulating layer having an aperture formed therethrough, the aperture having a lower region and an upper region, the lower region having generally parallel side walls and the upper region having sloped sidewalls, the upper region having a cross-sectional area that is larger than a cross-sectional area of the lower region by a delta value, the upper region and the lower region being self-aligned with each other;
   a first conductive layer having a first thickness, the first conductive layer being positioned within the aperture and in contact with the insulating layer and the conductive region of the first layer, the delta value relative to the first thickness of the first conductive layer forming a ratio;
   a second conductive layer within the aperture, the second conductive layer being in contact with the first conductive layer and being made of a material that protects the first conductive layer from etching, said second conductive layer within said aperture substantially filling said self-aligned upper and lower regions of said aperture so that a top surface of said second conductive layer is approximately planar with a top surface of said insulating layer; and
   a third conductive layer in electrical contact with the second conductive layer and overlying at least a portion of the second conductive layer.

2. The electrical connection structure of claim 1 wherein the ratio of the delta value to the thickness of the first conductive layer is approximately 2, such that the delta value is approximately twice the first thickness of the first conductive layer.

3. The electrical connection structure of claim 1 wherein the ratio of the delta value to the thickness of the first conductive layer is approximately 1, such that the delta value approximately equals the first thickness of the first conductive layer.

4. The electrical connection structure of claim 1 wherein the ratio of the delta value to the thickness of the first conductive layer is greater than 2 and less than a selected value to maintain the cross-sectional area of the upper region as a small area.

5. The electrical connection structure of claim 1 wherein the delta value is selected to be as small as possible to obtain a small said cross-sectional area of the upper region and sufficiently large to protect the first conductive layer from exposure to an etch being performed on the third conductive layer.

6. An electrical connection structure, comprising:
   a first layer having a conductive region;
   an insulating layer having an aperture formed therethrough, the aperture having a lower region and an upper region, the lower region have generally vertical side walls and the upper region having sloped sidewalls, the upper region having a cross-sectional area with a dimension that is larger than a dimension of a cross-sectional area of the lower region by a delta value, the upper and lower regions being self-aligned with each other;
   a first conductive layer having a thickness, the first conductive layer being positioned within the aperture and in contact with the insulating layer and the conductive region of the first layer;
   a second conductive layer within the aperture, the second conductive layer being in contact with the first conductive layer, the second conductive layer having an upper portion positioned within the upper region of the aperture and having a lower portion positioned within the lower region of the aperture, the upper portion of the second conductive layer having a larger cross-sectional area relative to the lower portion of the second conductive layer, the delta value being selected to sufficiently allow the upper portion of the second conductive layer to protect at least some of the first conductive layer from etching, said second conductive layer within said aperture substantially filling said self-aligned upper an lower regions of said aperture so that a top surface of said upper portion of said second conductive layer is approximately planar with a top surface of said insulating layer; and
   a third conductive layer in electrical contact with the second conductive layer and overlying at least a portion of the second conductive layer.

7. The electrical connection structure of claim 6 wherein the sloped sidewalls of the upper region have a generally constant slope.

8. The electrical connection structure of claim 6 wherein the sloped sidewalls of the upper region have a changing slope.

9. The electrical connection structure of claim 8 wherein the changing slope includes a curved slope.

10. The electrical connection structure of claim 6 wherein the delta value is substantially equal to the thickness of the first conductive layer.

11. The electrical connection structure of claim 6 wherein the delta value is approximately twice the thickness of the first conductive layer.

12. The electrical connection structure of claim 6 wherein the cross-sectional areas of the upper and lower regions of the aperture comprise substantially circular cross-sectional areas, and wherein the dimensions of the cross-sectional areas of the upper and lower regions of the aperture comprise radii measured from a same center of the aperture.

13. The electrical connection structure of claim 6 wherein the first conductive layer comprises a material having titanium, and wherein the second conductive layer comprises a material having tungsten.

14. The electrical connection structure of claim 6 wherein said top surface of said upper portion of the second conductive layer, which substantially fills said self-aligned upper and lower regions of the aperture, is flat.

* * * * *